United States Patent [19]

Brown, Jr. et al.

[11] 4,260,911

[45] Apr. 7, 1981

[54] TEMPERATURE COMPENSATED SWITCHING CIRCUIT AND METHOD

[75] Inventors: Paul M. Brown, Jr., Morgan Hill; Adib R. Hamade, Cupertino, both of Calif.

[73] Assignee: Precision Monolithics, Inc., Santa Clara, Calif.

[21] Appl. No.: 15,249

[22] Filed: Feb. 26, 1979

[51] Int. Cl.$^3$ ............................................. H03K 17/60
[52] U.S. Cl. .................................... 307/310; 307/289; 307/296 R; 357/28
[58] Field of Search ................. 357/28; 330/256, 266, 330/272, 289; 307/310, 270, 251, 296

[56] References Cited

U.S. PATENT DOCUMENTS

| 3,760,199 | 9/1973 | Graeme | 307/310 |
| 3,975,649 | 8/1976 | Kawagoe et al. | 307/310 |
| 4,008,406 | 2/1977 | Kawagoe | 307/310 |

Primary Examiner—Stanley D. Miller, Jr.
Assistant Examiner—B. P. Davis
Attorney, Agent, or Firm—Richard S. Koppel

[57] ABSTRACT

A junction FET switching circuit and method in which the gate-source voltage of the switching FET is varied with changing temperature so as to maintain the FET channel resistance substantially constant over a selected temperature range. An offset is introduced to the gate-source voltage to permit adequate voltage variation over the temperature range.

24 Claims, 2 Drawing Figures

TEMPERATURE COMPENSATED SWITCHING CIRCUIT AND METHOD

BACKGROUND OF THE INVENTION

A. Field of the Invention

This invention relates to electronic switching circuitry, and more particularly to a temperature compensated switching circuit and method for a junction field effect transistor (FET).

B. Description of the Prior Art

Junction FET technology has been used to successfully implement analog switches in monolithic integrated circuit forms. In such circuits a voltage is applied to the gate of the switching FET to establish an "off" condition when the FET is in a non-conducting or high impedance state, and an "on" condition when the FET presents a relatively small resistance.

FIG. 1 is a sectional diagram of a junction FET which may be employed as a switching element. The device, a bipolar p-channel FET, is shown for purposes of illustrating the temperature and operating characteristics of FETs. Other FET designs are also in use which exhibit analogous characteristics, and the invention described herein is applicable to all such devices. The device shown in FIG. 1, however, is generally capable of greater manufacturing control over certain parameters such as pinch-off voltage than are other junction FET constructions, such as n-channels.

A lightly doped p-type wafer 2 provides a substrate upon which a similarly lightly doped n-type epitaxial layer 4 is formed. Heavily doped p-type diffusions 6 and 8 are spaced along the upper portion of the epitaxial layer, with a heavily doped n-type diffusion 10 to one side of p-type diffusions 6 and 8. A p-type ion implant 12 connects the p-type diffusions and serves as the FET channel. Overlying channel 12, p-type diffusion 6, n-type diffusion 10 and at least a portion of p-type diffusion 8 is an n-type ion implant 14 which makes contact with the epitaxial layer 4. An insulating layer of silicon dioxide 16 overlies the structure described thus far, and has openings to provide access to the diffusion areas.

Source, drain and gate contacts, labeled S, D and G, are respectively made on implant area 14 over p-type diffusions 6 and 8, and n-type diffusion 10. Epitaxial layer 4 and ion implant 14 together surround channel 12 and function as the FET gate. In operation, channel 12 conducts current in response to a voltage differential across the source and drain. The application of a gate potential more positive in polarity than the source potential reduces the effective cross-sectional channel area, thereby reducing the current flow. At a certain gate voltage, denoted the pinch-off voltage, the channel becomes depleted of current carriers and the FET stops conducting current.

One of the advantages of a junction FET switch such as that just described is that, unlike a CMOS analog switch, its on-resistance remains relatively constant with analog voltage variations at low currents. However, the on-resistance of the junction FET varies considerably with temperature, typically in a directly proportional relationship of about 0.8–1.0 percent/°C., and can vary by as much as 100 percent or more from −55° C. to 125° C. (the standard military temperature range). This strong temperature dependence limits the utility of such switches in many applications.

The temperature dependance of a junction FET results from changes in the conductivity of the channel material and in the semiconductor barrier potential as the temperature varies. The channel resistance may be expressed as:

$$R = (rL)/A \qquad (1)$$

where R is the channel resistance, r is the bulk resistivity, L is the channel length, and A is the channel cross-sectional area. In general, r varies positively with temperature over the military range. A varies along the length of the channel according to the voltage gradient between source and drain and the relative gate voltage, and is also a temperature-dependent parameter because of the change in junction depletion layer width with temperature.

In an attempt to compensate for the temperature effect, monolithic analog switches have been designed with low on-resistances to be able to tolerate the large resistance variations. This is accomplished by configuring the circuit driver to hold the gate-source voltage of the switching FET at zero volts when the switch is in the "on" state. However, very low on-resistances require a very large FET switching device. This makes the device less economical to produce, and the increased switch capacitance imposes speed limitation on its operation. These factors contribute to a continued widespread use of electromechanical switches.

SUMMARY OF THE INVENTION

In view of the above problems associated with the prior art, it is an object of the present invention to provide a junction FET switching circuit in which the switch "on" resistance is controllable to a substantially constant level over a desired temperature range, and a method for accomplishing the same.

Another object of the invention is the provision of a temperature compensation circuit having an output voltage which varies substantially linearly with temperature in accordance with a predetermined voltage-temperature coefficient over a desired temperature range.

A further object of the invention is the provision of a junction FET switching circuit employing a relatively small switching device.

These and other objects of the invention are realized by the provision of a junction FET switching circuit in which a temperature compensation circuit varies the gate-source voltage of the switching FET in response to varying temperature so as to maintain the FET channel resistance at a desired level or levels over a selected temperature range. The compensation circuit includes temperature-responsive circuit elements which establish the FET gate-source voltage, and also a temperature-insensitive bias circuit which is connected to establish an offset gate-source voltage level for the switching FET to maintain a reverse bias across the gate-source terminals over the selected temperature range.

In a preferred embodiment the temperature compensation circuit includes a voltage drop circuit having a predetermined voltage-temperature coefficient, and a current responsive means which establishes a voltage level determined by the level of current through the current-responsive means. A temperature-responsive current source delivers a control current to the current-responsive means, to establish a voltage level for the current-responsive means at which the gate-source voltage applied to the switching FET varies with temperature to maintain the FET channel resistance approximately constant over the selected temperature range.

The current-responsive means comprises a second junction FET, and the current source means comprises the combination of a third junction FET connected to drive a current through the second FET to equalize the gate-source voltages of the second and third FETs, and a bias circuit for the third FET. The bias circuit has a voltage-temperature coefficient which is a predetermined multiple of the coefficient for the voltage drop circuit, such that the gate-source voltage of the second FET together with the voltage drop circuit establishes a gate-source voltage for the switching FET which varies with temperature to maintain the switching FET channel resistance approximately constant. The bias circuit in turn comprises first and second proportioning circuits connected respectively to the gate and source of the third FET. One of the proportioning circuits provides an offset bias level.

The appropriate voltage-temperature coefficient for the switching FET gate-source voltage is attained by providing the voltage drop circuit as a pair of p-n junction devices connected to produce a cumulative voltage-temperature coefficient twice that of a single p-n junction. One of the proportioning circuits has an output voltage-temperature coefficient substantially equal to that of a p-n junction, while the other proportioning circuit includes a voltage divider which yields an output voltage-temperature coefficient of about one-half that of a single p-n device. The net voltage-temperature coefficient of the switching FET gate-source voltage is one and one-half times that of a single p-n junction, or about $-3.15$ mV/°C.

DESCRIPTION OF THE DRAWINGS

These and other objects and features of the invention will be apparent from the following description of a preferred embodiment thereof taken together with the accompanying drawings, in which.

DETAILED DESCRIPTION OF A PREFERRED EMBODIMENT

It has been found that, by varying the gate-source voltage of a switching FET as the ambient temperature changes, a voltage-temperature coefficient may be attained at which the increase in channel resistance from increasing temperature is substantially cancelled by a decrease in channel resistance from a reduction in the gate-source voltage. For a typical FET with a "pinch-off" voltage of 1.9 volts, a voltage-temperature coefficient of $-3.15$ mV/°C. will accomplish the required cancellation. The value of this coefficient will change somewhat for different pinch-off voltages.

A circuit designed in accordance with the present invention for establishing this voltage-temperature relationship makes use of the predictable voltage-temperature coefficient of p-n junction devices. The coefficient for a p-n junction is about $-2.1$ mV/°C., which figure is substantially independent of the geometry of the junction and is only slightly dependent on the doping levels. By controlling the gate-source voltage of the switching FET to vary with temperature in a manner equivalent to one and one/half p-n junctions, the required coefficient of $-3.15$ mV/°C. can thus be attained. While a particular circuit is shown and described herein for attaining this particular coefficient, the invention is not limited to the details of this circuit, but rather encompasses the general concept of varying the gate-source voltage of a switching FET with changing temperature to establish the channel resistance at desired levels over a selected temperature range.

Figure 1:
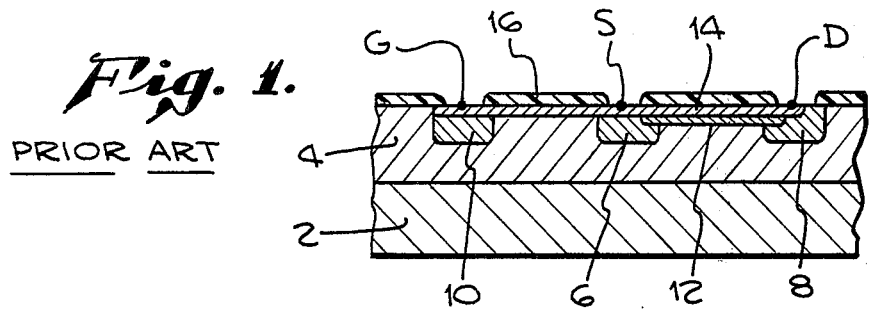
FIG. 1 is a cross-sectional diagram showing a junction FET construction preferred for the invention.
Figure 2:
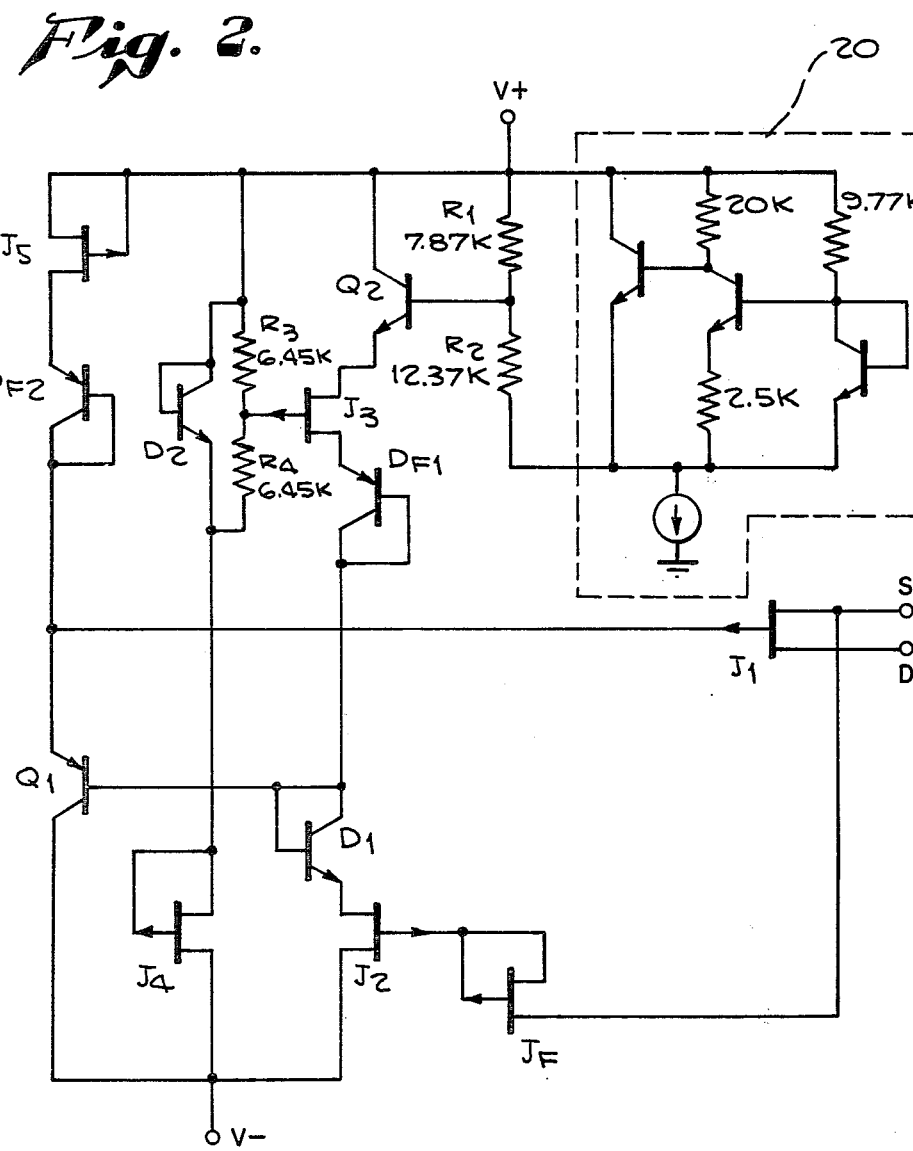
FIG. 2 is a circuit diagram of the temperature compensated switching circuit of the present invention.

Referring to FIG. 2, which shows a preferred integrated circuit implementation, a switching junction FET $J_1$ has source and drain terminals labeled S and D, respectively. Connected between the gate and source of $J_1$ and controlling the voltage thereof is a temperature compensation circuit which includes the base-emitter circuit of a p-n-p transistor $Q_1$, a diode-connected transistor $D_1$, the gate-source circuit of a second junction FET $J_2$, and another junction FET $J_f$ which provides fault protection but does not otherwise affect circuit operation. It can be seen that the gate-source voltage for $J_1$ is substantially equal to the sum of the base-emitter voltage of $Q_1$, the base-emitter voltage of $D_1$, and the gate-source voltage of $J_2$ (the voltage drop across $J_f$ being negligible).

$Q_1$ and $D_1$ together form a voltage-drop circuit with a cumulative voltage-temperature coefficient equal to that of the total of their two p-n junctions contained in the circuit, or about $-4.2$ mV/°C. The gate-source voltage drop across $J_2$ is determined by the current through $J_2$, which in turn is controlled by a temperature-responsive current source comprising a third junction FET $J_3$ matched to $J_2$, and a pair of proportioning circuits connected respectively to the gate and source of $J_3$. The $J_3$ drain is connected through a fault protection diode connected transistor $D_2$ and thence through $D_1$ to the source of $J_2$. $J_3$ and $J_2$ thus establish a master-slave relationship with the current through $J_2$ controlled by and substantially equal to the current through $J_3$. As a consequence, the gate-source voltage of $J_2$ is also substantially equal to the gate-source voltage of $J_3$ and is controlled by controlling the $J_3$ gate-source voltage.

The proportioning circuits referred to above form a gate-source bias circuit for $J_3$. One of the proportioning circuits comprises a transistor $Q_2$ having its emitter connected to the source of $J_3$, its collector connected to a positive voltage terminal, and its base connected for biasing between resistances $R_1$ and $R_2$ of a voltage divider network. The other end of $R_1$ is connected to the positive voltage terminal, while the opposite end of $R_2$ is connected to the output of a temperature-insensitive bias circuit 20, the output voltage of which is maintained at a substantially constant increment below the positive supply voltage terminal. Circuit 20 is preferably a "standard bandgap reference" circuit of the type described in application note AN 56 "1.2 Volt Reference" by Robert C. Dobkin, December 1971, published in the National Semiconductor Corporation "Linear Applications Handbook No. 1". This circuit maintains a substantially constant 1.2 volts across the $R_1/R_2$ divider network despite changes in ambient temperature within the operating temperature range.

The output voltage presented to the source of $J_3$ by the above proportioning circuit is thus equal to the positive supply voltage minus the sum of the voltage drop across $R_1$ and the base-emitter voltage of $Q_2$. Since the voltage drop across $R_1$ is temperature invariant, the output voltage-temperature coefficient of the proportioning circuit is equal to the coefficient for the p-n base emitter junction of $Q_2$.

The other proportioning circuit comprises a diode connected transistor $D_2$ connected to the positive voltage bus on one side and on the other side to a negative voltage bus through a junction FET $J_4$ having its source and gate tied together to function as a current source. A voltage divider circuit comprising series connected resistors $R_3$ and $R_4$ is connected in parallel with $D_2$, and the gate of $J_3$ is connected to an intermediate point in the voltage divider circuit between $R_3$ and $R_4$. By setting the value of $R_3$ equal to $R_4$, the voltage at the gate of $J_3$ is kept at one-half the base-emitter voltage of $D_2$, thereby maintaining the voltage-temperature coefficient at the gate of $J_3$ at one-half the voltage-temperature coefficient for the p-n base-emitter junction of $D_2$, or about $-1.05$ mV/°C.

Since the voltage-temperature coefficient at the source of $J_3$ is equal to that of a p-n junction while the coefficient at the gate of $J_3$ is half that of a p-n junction, the net gate-source voltage-temperature coefficient for $J_3$ is one half that of a p-n junction. This multiple may be varied if desired by chainging the ratio of $R_3$ to $R_4$ to change the coefficient at the gate of $J_3$, and thus the net gate-source coefficient for $J_3$.

The ratio of $R_1$ to $R_2$ is selected to establish an offset voltage at the base of $Q_2$ which keeps the gate-source circuit of $J_1$ reverse biased over the temperature range of interest. With positive and negative voltage sources of plus and minus 15 volts and the resistance values shown in FIG. 2, the gate-source voltage of $J_1$ is about 400 mV at 25° C. This is sufficient to keep the gate-source junction of $J_1$ reverse biased over the military temperature range of $-55°$ to 125° C.

The remaining components of the circuit are a current source connected junction FET $J_5$ and a fault protection diode $D_{f2}$ connected in series between the positive voltage terminal and the emitter of $Q_1$.

In operation, an increase in temperature would cause the channel resistance of $J_1$ to increase if the gate-source voltage of $J_1$ remained constant. However, the temperature increase causes the total voltage drop across $Q_1$ and $D_1$ to decrease at the rate of 4.2 mV/°C., and the gate-source voltage of $J_3$ to increase at the rate of 1.05 mV/°C. (Since the base-emitter voltages of $D_2$ and $Q_2$ decrease with increasing temperatures, the emitter voltages of both devices will increase towards the more positive base voltages with increasing temperature). The increased gate-source voltage of $J_3$ decreases the current through both $J_3$ and $J_2$, in turn increasing the gate-source voltage of $J_2$ by an amount equal to the increase for $J_3$. The net change in gate-source voltage for switching FET $J_1$ is $-3.15$ mV/°C., which is sufficient to approximately balance off the effects of channel material conductivity and barrier potential and keep the "on resistance" of $J_1$ approximately constant over the temperature range of interest. Thus, switching FET $J_1$ can be kept to a desirably small size without introducing the wide swings in resistance values encountered in the prior art.

With the circuit shown in FIG. 2, which is designed for a $J_1$ pinch-off voltage of 1.9 volts, a switch resistance drift of approximately 0.04 percent/°C. was achieved. This drift tended to increase for different pinch-off voltages, but can be brought back down by modifying the component values.

Numerous modifications and variations of the embodiment shown and described above will be apparent to one skilled in the art. For example, it may be feasible to establish a gate-source voltage-temperature coefficient for $J_3$ equal to one and one-half times that of a p-n junction, rather than the factor of one-half mentioned above. In this case the gate-source voltage of $J_1$ could be controlled entirely by the controlled current delivered to $J_2$, and $Q_1$ and $D_1$ could be eliminated. Accordingly, it is intended that the present invention be limited only in terms of the appended claims.

We claim:
1. A junction FET switching circuit, comprising:
   a junction FET having a gate, a source, a drain and a channel between said source and drain, said FET being connectable at its source and drain to provide a switching element, and the channel resistance varying in a known fashion with temperature and the gate-source voltage, and
   a temperature compensation circuit means adapted to generate a temperature-dependent voltage having a voltage-temperature coefficient substantially equal to the FET gate-source voltage-temperature coefficient required to maintain the channel resistance at a substantially constant level over a selected temperature range, said circuit means being connected to apply said voltage to the gate-source terminals of the FET, and thereby vary the gate-source voltage of the FET to maintain the channel resistance substantially constant over said temperature range.

2. The junction FET switching circuit of claim 1, said temperature compensation circuit means including means for establishing the gate-source voltage at non-zero levels corresponding to channel resistances of greater than minimal values over the selected temperature range.

3. The junction FET switching circuit of claim 1, said temperature compensation circuit means including temperature-responsive circuit elements connected to establish the FET gate-source voltage, and further comprising a temperature-insensitive bias circuit having a predetermined output level connected to establish a desired offset gate-source voltage for said FET to maintain a reverse bias across the FET gate-source terminals over the selected temperature range.

4. A junction FET switching circuit, comprising:
   a first junction FET having a gate, a source, a drain, and a channel between said source and drain, said first FET being connectable at its source and drain to provide a switching element, and the channel resistance varying in a known fashion with temperature and the gate-source voltage,
   a temperature compensation circuit connected to apply a gate-source voltage to said first FET, said circuit including a voltage drop circuit having a predetermined voltage-temperature coefficient, and a current-responsive means establishing a voltage level determined by the level of current therethrough, and
   temperature-responsive current source means connected to deliver a temperature-dependent control current to said current-responsive means, the value of said control current being sufficient to establish a temperature-determined voltage level for said current-responsive means at which the gate-source voltage applied by the temperature compensation circuit to the first FET varies with temperature to maintain the first FET channel resistance approximately constant over a selected temperature range.

5. The junction FET switching circuit of claim 4, said current-responsive means comprising a second junction FET having its gate-source terminals connected in said temperature compensation circuit, and said current source means comprising the combination of a third junction FET connected to drive a current through said second FET directly proportional to its own current magnitude and thereby establish a gate-source voltage for said second FET directly proportional to the gate-source voltage of said third FET, and a bias circuit connected to apply a gate-source voltage to said third FET, said bias circuit having an output voltage-temperature coefficient which is a predetermined multiple of the voltage-temperature coefficient of said voltage drop circuit, said multiple being selected such that the gate-source voltage of said second FET together with the voltage across said voltage drop circuit establishes a gate-source voltage for said first FET which varies with temperature to maintain the first FET channel resistance approximately constant over said selected temperature range.

6. The junction FET switching circuit of claim 5, said bias circuit comprising first and second proportioning circuits respectively characterized by output voltage-temperature coefficients which mutually differ by an amount equal to said predetermined multiple, and having their outputs connected respectively to the gate and source terminals of said third FET.

7. The junction FET switching circuit of claim 6, one of said proportioning circuits including temperature-insensitive bias means for adding a predetermined offset level to its output voltage, said predetermined offset level being selected to maintain a reverse bias across the gate-source terminals of said first FET over the selected temperature range.

8. The junction FET switching circuit of claim 6, said voltage drop circuit comprising a first p-n junction means, one of said proportioning circuits being characterized by an output voltage-temperature coefficient substantially equal to that of a p-n junction, and the other proportioning circuit comprising the combination of a second p-n junction means and a voltage divider circuit connected in parallel therewith, the voltage output of said other proportioning circuit being taken at a selected intermediate point on said divider circuit to produce the desired predetermined multiple.

9. The junction FET switching circuit of claim 8, said first p-n junction means comprising a pair of p-n junction devices connected to produce a cumulative voltage-temperature coefficient twice that of a single p-n junction, said second p-n junction means comprising a single p-n junction device having a voltage-temperature coefficient equal to that of a single p-n junction, the voltage output of said other proportioning circuit being taken at a point on the divider circuit to produce a multiple value of substantially one-half, and said second FET being connected in the temperature compensation circuit with respect to said third FET to substract from the voltage-temperature coefficient of the voltage drop circuit, and thereby produce a net voltage-temperature coefficient for the temperature compensation circuit substantially equal to one and one-half times the voltage-temperature coefficient of a p-n junction.

10. The junction FET switching circuit of claim 5, said third FET being connected to drive a current through said second FET substantially equal to its own current.

11. A junction FET switching circuit, comprising:

a first junction FET comprising a gate, a source, a drain, and a channel between said source and drain, said first FET being connectable at its source and drain to provide a switching element, and the channel resistance varying in a known fashion with temperature and the gate-source voltage, a temperature compensation circuit connected to apply a gate-source voltage to said first FET, said circuit including a current-responsive means establishing a voltage level determined by the level of current therethrough, and temperature-responsive current source means connected to deliver a temperature-dependent control current to said current-responsive means, the value of said control current being sufficient to establish a temperature-determined voltage level for said current-responsive means at which the gate-source voltage applied by the temperature compensation circuit to the first FET varies with temperature to maintain the first FET channel resistance approximately constant over a selected temperature range.

12. The junction FET switching circuit of claim 11, said current-responsive means comprising a second junction FET having its gate-source terminals connected in said temperature compensation circuit, and said current source means comprising the combination of a third junction FET connected to drive a current through said second FET and thereby establish a gate-source voltage for said second FET directly proportional to the gate-source voltage of said third FET, and a bias circuit connected to apply a gate-source voltage to said third FET characterized by a voltage-temperature coefficient which is adapted to produce the desired control current for said second FET.

13. A junction FET switching circuit, comprising:

a first junction FET having a gate, a source, a drain, and a channel between said source and drain, said first FET being connectable at its source and drain to provide a switching element, and the channel resistance varying in a known fashion with temperature and the gate-source voltage, a temperature compensation circuit connected between the gate and source of said first FET, comprising at least one p-n junction device and a second junction FET with its gate and source terminals connected in the temperature compensation circuit, a third junction FET connected to supply a control current to said second FET equal to its own current, a first proportioning circuit connected to provide an output voltage level to the source of said third FET, said first proportioning circuit comprising a temperature-insensitive voltage source, and a first p-n junction device having an input from said voltage source and connected to provide a temperature-sensitive voltage to the source of said third FET characterized by a voltage-temperature coefficient substantially equal to that of a p-n junction, and a second proportioning circuit connected to provide an output voltage level to the gate of said third FET, said second proportioning circuit comprising the combination of a second p-n junction device and a voltage divider circuit connected in parallel therewith, an intermediate point on said divider circuit being connected to provide a temperature-sensitive output voltage characterized by a voltage-temperature coefficient less than that of a p-n junction, said intermediate point and p-n junction devices in the temperature compensation circuit being selected to vary the gate-source voltage applied by the temperature compensation circuit to the first FET with temperature so as to maintain the first FET channel resistance approximately constant over a selected temperature range.

14. The junction switching circuit of claim 13, said temperature compensation circuit comprising a pair of p-n junction devices connected to produce a cumulative voltage-temperature coefficient twice that of a single p-n junction, and said second FET being connected in said circuit to subtract from the voltage-temperature coefficient of said pair, and said second proportioning circuit providing a voltage output characterized by a voltage-temperature coefficient substantially equal to one-half that of a p-n junction, whereby the gate source voltage of said first FET is constrained to vary with temperature in accordance with a net voltage-temperature coefficient substantially equal to one and one-half times that of a p-n junction over the selected temperature range.

15. The junction FET switching circuit of claim 14, said pair of p-n junction devices comprising the emitter-base circuit of a transistor, and the base/collector-emitter circuit of a diode-connected transistor, said diode-connected transistor being connected to conduct current from said third FET to said second FET.

16. The junction FET switching circuit of claim 13, said first proportioning circuit comprising a transistor biased by said temperature-insensitive voltage source and connected to conduct current to said third FET, the bias level for said transistor being selected to establish a current through said third FET of sufficient magnitude to maintain a reverse bias offset voltage across the gate-source terminals of said first FET over said selected temperature range.

17. The junction FET switching circuits of claims 1, 4, 11 or 13, said temperature compensation circuit varying the gate-source voltage of the first FET at a rate of substantially $-3.15$ mV/°C.

18. Circuit means for producing an output voltage having a desired voltage-temperature coefficient over a selected temperature range, comprising:

a voltage drop circuit having a predetermined voltage-temperature coefficient, current responsive circuit means connected in circuit with said voltage drop circuit and establishing a voltage level determined by the current level through said current responsive means, and temperature-responsive current source means connected to deliver a temperature-dependent control current to said current responsive means, the value of said control current being sufficient to establish a temperature-determined voltage for said current-responsive means which, together with the voltage for said voltage drop circuit, provides the desired output voltage.

19. The circuit means of claim 18, said current-responsive means comprising a slave junction FET, and said current source means comprising the combination of a master junction FET connected to drive a current through said slave FET and thereby establish a gate-source voltage for said slave FET directly proportional to the current through said master FET, and a bias circuit connected to apply a gate-source voltage to said master FET, said bias circuit having a voltage-temperature coefficient which is a predetermined multiple of the voltage-temperature coefficient of said voltage drop circuit, said multiple being selected such that the gate-source voltage of said slave FET together with the voltage across said voltage drop circuit establishes the desired circuit output voltage.

20. The circuit means of claim 19, said bias circuit comprising first and second proportioning circuits characterized by output voltage-temperature coefficients which mutually differ by an amount equal to said predetermined multiple, and having their outputs connected respectively to the gate and source terminals of said master FET.

21. The circuit means of claim 20, said voltage drop circuit comprising a first p-n junction means, one of said proportioning circuits being characterized by an output voltage-temperature coefficient substantially equal to that of a p-n junction, and the other proportioning circuit comprising the combination of a second p-n junction means and a voltage divider circuit connected in parallel therewith, the voltage output of said other proportioning circuit being taken at a selected intermediate point on said divider circuit to produce the predetermined multiple.

22. A junction FET switching circuit, comprising:

a junction FET having a gate, a source, a drain, and a channel between said source and drain, said FET being connectable at its source and drain to provide a switching element, and the channel resistance varying in a known fashion with temperature and the gate-source voltage, a temperature compensation circuit connected to apply a gate-source voltage to said FET, said circuit including a voltage drop circuit having a predetermined voltage-temperature coefficient, and a signal-responsive means establishing a voltage level determined by the signal level applied thereto, and temperature-responsive signal generating means connected to apply a temperature-dependent control signal to said signal-responsive means, the value of said control signal being sufficient to establish a temperature-determined voltage level for said signal-responsive means at which the gate-source voltage applied by the temperature compensation circuit to the FET varies with temperature to maintain the FET channel resistance approximately constant over a selected temperature range.

23. The method of controlling the channel resistance of a junction FET switching transistor over a selected temperature range, comprising the steps of:

generating a temperature dependent voltage characterized by a voltage level and voltage-temperature coefficient equal to the FET gate-source voltage bias necessary to maintain the channel resistance substantially constant over a selected temperature range, and applying said voltage across the gate and source of the FET.

24. The method of claim 23, and further including the steps of generating a temperature-insensitive bias voltage of sufficient magnitude to maintain a reverse bias across the FET gate-source terminals over the selected temperature range, and applying said bias voltage as a reverse bias offset across the gate and source of the FET.

* * * * *